United States Patent
Yonak et al.

(10) Patent No.: US 10,486,548 B2
(45) Date of Patent: Nov. 26, 2019

(54) POWER INVERTER FOR A VEHICLE

(71) Applicant: Ford Global Technologies, LLC, Dearborn, MI (US)

(72) Inventors: Serdar Hakki Yonak, Ann Arbor, MI (US); Fan Xu, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 14/994,851

(22) Filed: Jan. 13, 2016

(65) Prior Publication Data
US 2017/0197511 A1 Jul. 13, 2017

(51) Int. Cl.
| | |
|---|---|
| *H02P 5/68* | (2006.01) |
| *B60L 50/51* | (2019.01) |
| *H02P 27/06* | (2006.01) |
| *H02M 7/00* | (2006.01) |
| *B60L 15/00* | (2006.01) |
| *H05K 7/14* | (2006.01) |
| *B60L 50/61* | (2019.01) |
| *B60L 50/16* | (2019.01) |

(52) U.S. Cl.
CPC ............. *B60L 50/51* (2019.02); *B60L 15/007* (2013.01); *B60L 50/16* (2019.02); *B60L 50/61* (2019.02); *H02M 7/003* (2013.01); *H02P 5/68* (2013.01); *H02P 27/06* (2013.01); *H05K 7/1432* (2013.01); *B60L 2210/40* (2013.01); *Y02T 10/6217* (2013.01); *Y02T 10/644* (2013.01); *Y02T 10/645* (2013.01); *Y02T 10/7005* (2013.01); *Y02T 10/7077* (2013.01); *Y02T 10/7241* (2013.01)

(58) Field of Classification Search
CPC ......... B60L 11/1803; H02P 5/68; H02P 27/06
USPC .................................................. 318/34
See application file for complete search history.

(56) References Cited

U.S. PATENT DOCUMENTS

| | | | |
|---|---|---|---|
| 9,418,921 B2* | 8/2016 | Yang ................. | H01L 23/49562 |
| 2004/0089934 A1* | 5/2004 | Shimoida .............. | H01L 25/071 |
| | | | 257/686 |
| 2006/0151874 A1* | 7/2006 | Milich .................. | H01L 25/072 |
| | | | 257/713 |
| 2008/0251909 A1 | 10/2008 | Tokuyama et al. | |
| 2011/0013364 A1* | 1/2011 | Howes ............... | H05K 7/20936 |
| | | | 361/700 |
| 2012/0063090 A1* | 3/2012 | Hsiao ..................... | H01L 23/44 |
| | | | 361/699 |

(Continued)

FOREIGN PATENT DOCUMENTS

WO WO 2011004081 A1 * 1/2011 ..... H01L 21/823481

OTHER PUBLICATIONS

Denso, "Products for Electric and Hybrid Vehicles", Downloaded Jan. 8, 2016, 13pgs.

*Primary Examiner* — Kawing Chan
(74) *Attorney, Agent, or Firm* — David B. Kelley; Brooks Kushman P.C.

(57) ABSTRACT

A power inverter includes an array of stacked cards each having switches arranged to transform direct current from a battery into alternating current (AC). Each of the cards also includes a first terminal attached to some of the switches and configured to pass AC therefrom to a first electric machine, and a second terminal attached to other of the switches and configured to pass AC therefrom to a second electric machine. First and second substrates of the power inverter sandwich the switches and terminals.

12 Claims, 6 Drawing Sheets

(56) References Cited

U.S. PATENT DOCUMENTS

2013/0015495 A1\* 1/2013 Hauenstein ........... H01L 25/071
  257/140
2013/0050947 A1\* 2/2013 Kadoguchi ........... H01L 23/051
  361/715
2015/0138734 A1 5/2015 Guo \* cited by examiner

US 10,486,548 B2

POWER INVERTER FOR A VEHICLE

TECHNICAL FIELD

The present disclosure relates to power inverters for vehicles.

BACKGROUND

Vehicles such as battery-electric vehicles (BEVs), plug-in hybrid electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert the direct current coming from the battery into alternating current compatible with the electric machines. The power inverter may also act as a rectifier to convert alternating current from the electric machines to direct current compatible with the battery.

SUMMARY

According to one embodiment, a power inverter includes an array of stacked cards each having switches arranged to transform direct current from a battery into alternating current (AC). Each of the cards also includes a first terminal attached to some of the switches and configured to pass AC therefrom to a first electric machine, and a second terminal attached to other of the switches and configured to pass AC therefrom to a second electric machine. Each of the cards further includes first and second substrates that sandwich the switches and terminals.

According to another embodiment, a power module assembly of a vehicle inverter includes an array of stacked cards each having a plurality of switches arranged to transform direct current from a battery into alternating current (AC). Each of the cards further includes first and second substrates sandwiching the switches and defining a first terminal configured to pass AC therefrom to a first electric machine, and a second terminal configured to pass AC therefrom to a second electric machine.

According to yet another embodiment, a power module assembly of a vehicle inverter system includes an array of stacked cards each having a plurality of switches arranged to transform direct current from a battery into alternating current (AC). Each of the cards also includes a first terminal attached to some of the switches and configured to pass AC therefrom to a first electric machine, and a second terminal attached to other of the switches and configured to pass AC therefrom to a second electric machine. Each of the cards further includes first and second substrates that sandwich the switches and terminals.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
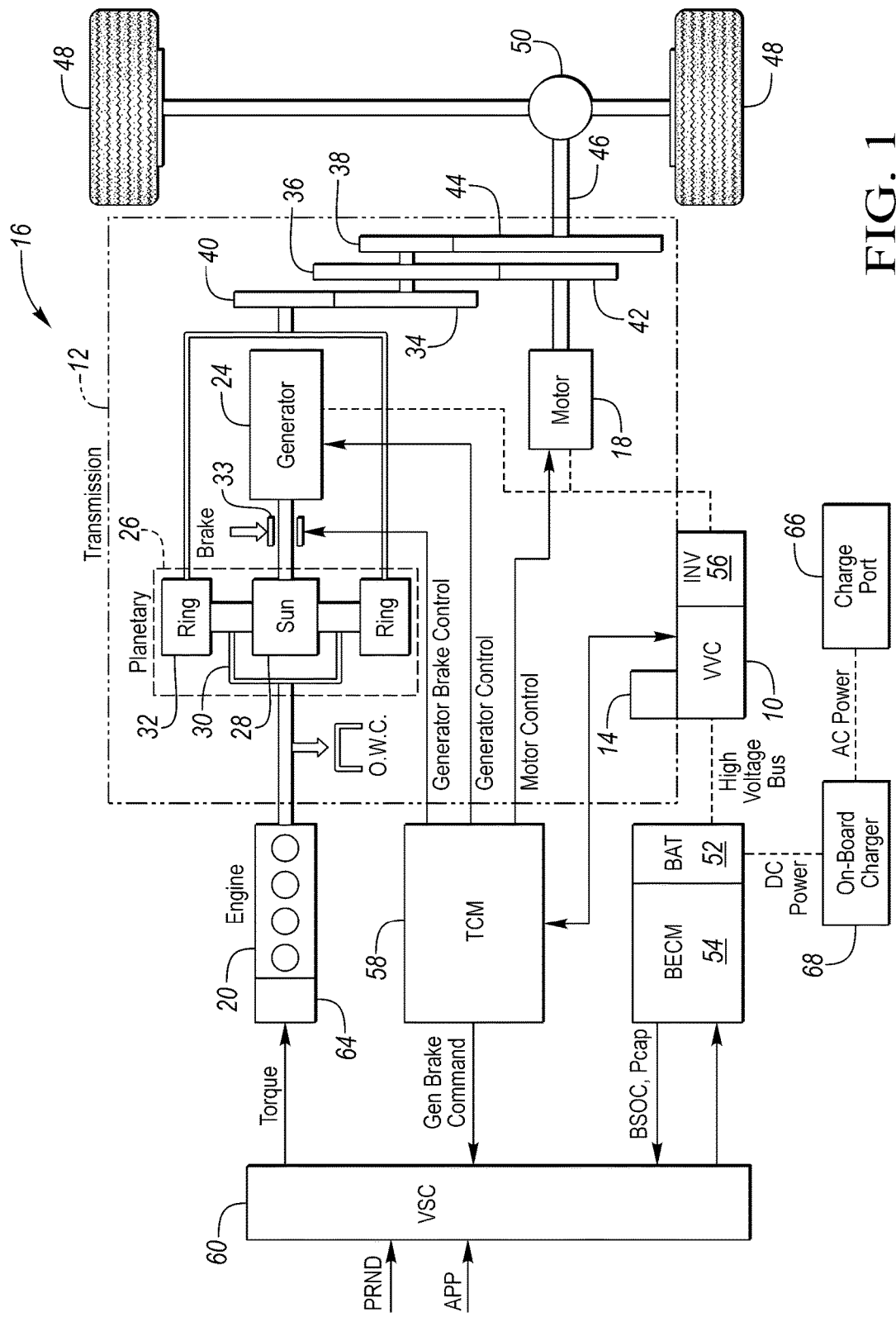
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with selective assistance from an internal combustion engine 20. The electric machine 18 may be an alternating current (AC) electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 may include a planetary gear unit 26, which includes a sun gear 28, a planet carrier 30, and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 may further include a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48.

The vehicle 16 includes an energy storage device, such as a traction battery 52 for storing electrical energy. The battery 52 is a high-voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high-voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the main battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one invertor associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
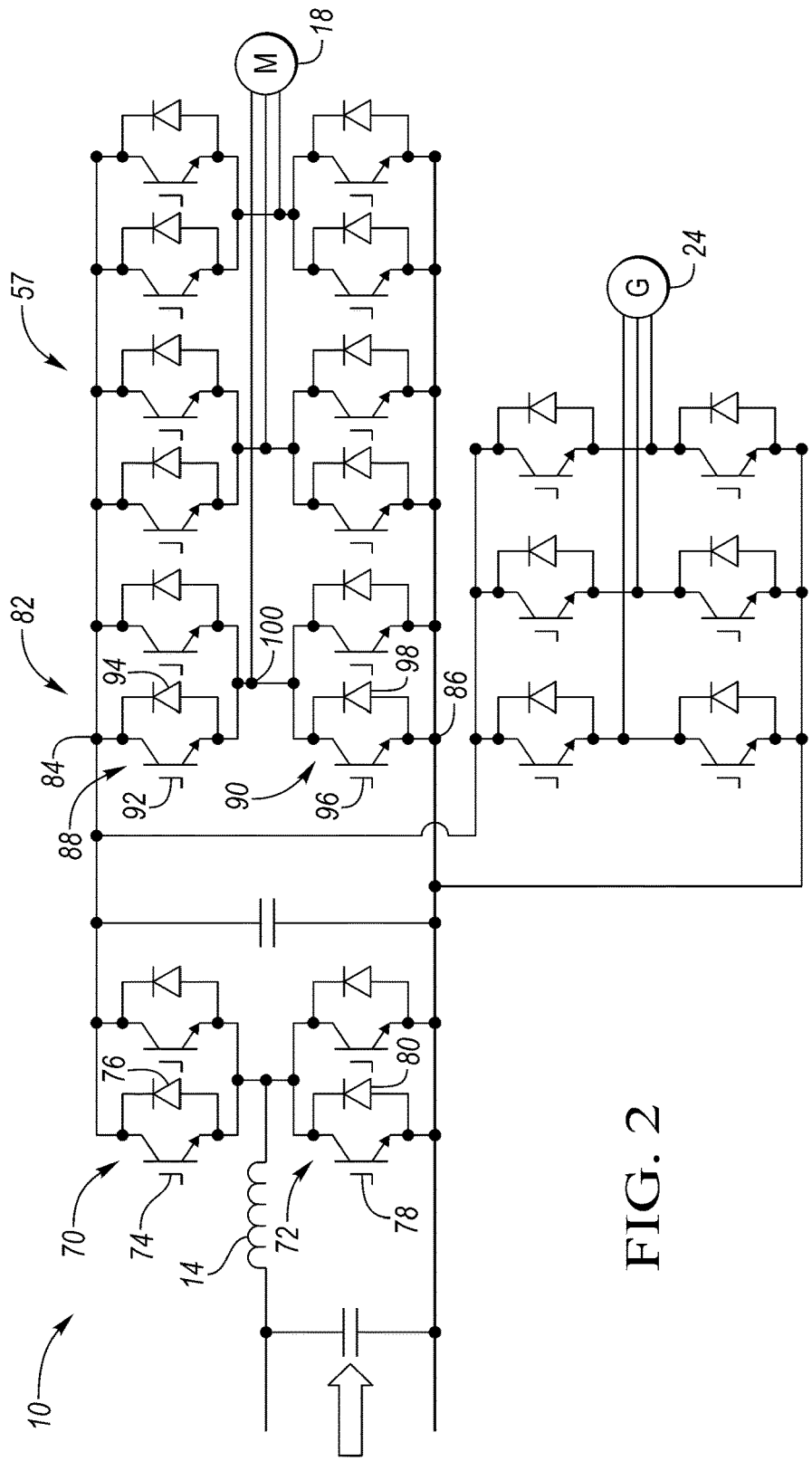
FIG. 2 is a schematic diagram of a variable voltage converter and a power inverter.

Referring to FIG. 2, an electrical schematic of the VVC 10 and the power module assembly 57 of the power inverter 56 is shown. The VVC 10 may include a one or more cards having at least a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). In one embodiment the switch 70 may be a reverse conducting insulated gate bipolar transistor (RCIGBT). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations.

The power module assembly 57 may include a plurality of cards (also known as power modules) that are stacked in an assembly. Each of the cards may include one or more half bridges 82 having a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected anti-parallel to a first diode 94. The second switching unit 90 may include a second transistor 96 connected anti-parallel to a second diode 98. The first and second transistors 88, 96 may be IGBTs or FETs. The first and second switching units 88, 90 may be similar to the switching units 70, 72. The first and second switching units of the each of the half-bridges 82 convert the DC power of the battery into a single phase AC output at the AC lead 100. Each of the AC leads 100 are electrically connected to the motor 18 or generator 24.

Figure 3:
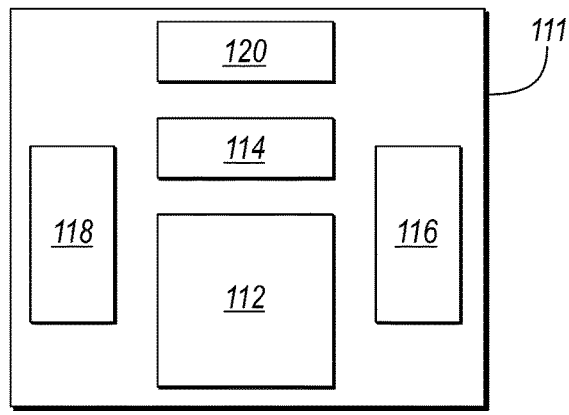
FIG. 3 is a schematic diagram of a vehicle power inverter.

Referring to FIG. 3, a power inverter 111 includes a power module 112 that is electrically connected with a gate drive board 114 and a capacitor bank 116. The power module 112 may include a plurality of cards each having one or more half bridges. The power inverter 111 may also include an inductor 118 and a control board 120.

Figure 4:
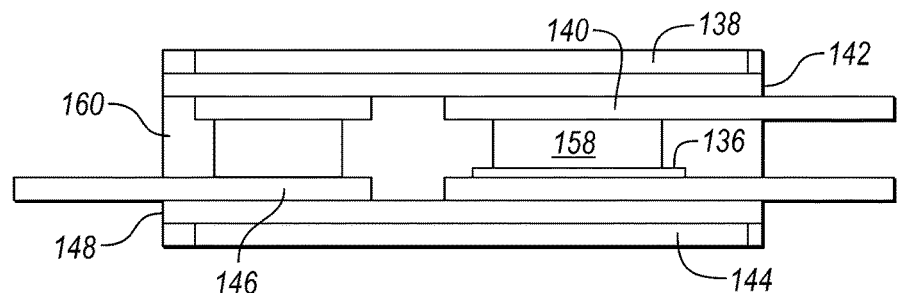
FIG. 4 is cross-sectional view of a card of the vehicle power inverter.
Figure 5:
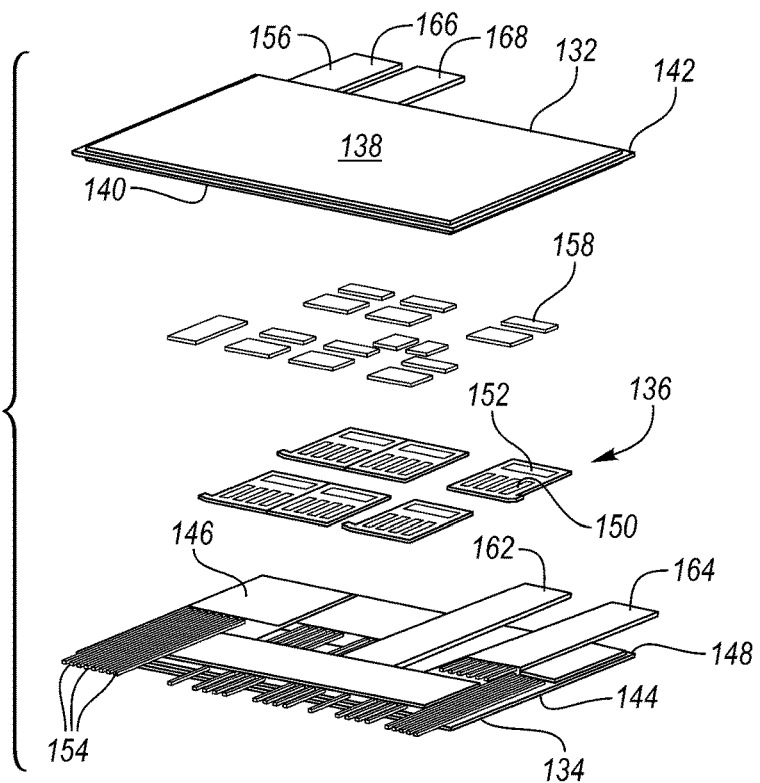
FIG. 5 is an exploded view of the card of FIG. 4.

Referring to FIGS. 4 and 5 a card 130 for a power module (such as power module 112) includes a first substrate 132 and a second substrate 134 that sandwich a plurality of switching units 136. The first substrate 132 includes an outer panel 138, an inner panel 140, and a dielectric layer 142 disposed between the inner and outer panels. The outer panel 138 defines an outer major side of the card, the inner panel 140 defines an inner major side of the substrate, and the thin edges of the panels and dielectric layer collectively define a portion of the minor sides of the card. The panels and dielectric layer are bonded together by a high-temperature oxidation process for example. The inner and outer panels 138, 140 may be metal such as copper, aluminum, silver, or gold. In one embodiment, the outer panel 138 is unpatterned copper and the inner panel 148 is patterned copper. The term "patterned" refers to a panel that has been etched to define an electrical circuit. The dielectric layer 142 may be ceramic. Example ceramics include alumina, aluminum nitride, and silicon nitride. In some embodiments, the ceramics may be doped. The second substrate 134 also includes an outer panel 144, in inner panel 146, and a dielectric layer 148. The materials of the inner and outer panels and the dielectric layer maybe similar to that described above with respect to the first substrate 132.

The card 130 includes one or more switching units 136 (also known as chips or dies), such as six switching units shown in the illustrated embodiment of FIG. 4. Each of the switching units 136 includes a transistor 150 and a diode 152. The transistor 150 may be, but is not limited to, IGBTs or FETs. Each of the switching units 136 is electrically connected to one or both of the inner panel 140 and/or the inner panel 146. The card 130 includes a plurality of shims 158 that electrically connect the switching units 136 to one of the inner panels and act as spacing features. A mold compound 160 encapsulates the internal components of the card 130.

The card 130 also includes a plurality of terminals 156 and signal pins 154. For example, the card 130 may include a positive DC terminal 162, a negative DC terminal 164, a generator AC terminal 166, and a motor AC terminal 168. The DC terminals 162, 164 are electrically connected with the capacitor bank and the traction battery. The AC terminals 166, 168 are electrically connected to an associated electric machine. The signal pins 154 are electrically connected to the gate drive board. The terminals and pins may be formed by a patterned inner panel or may be separate components attached to the switching units 136.

Figure 6:
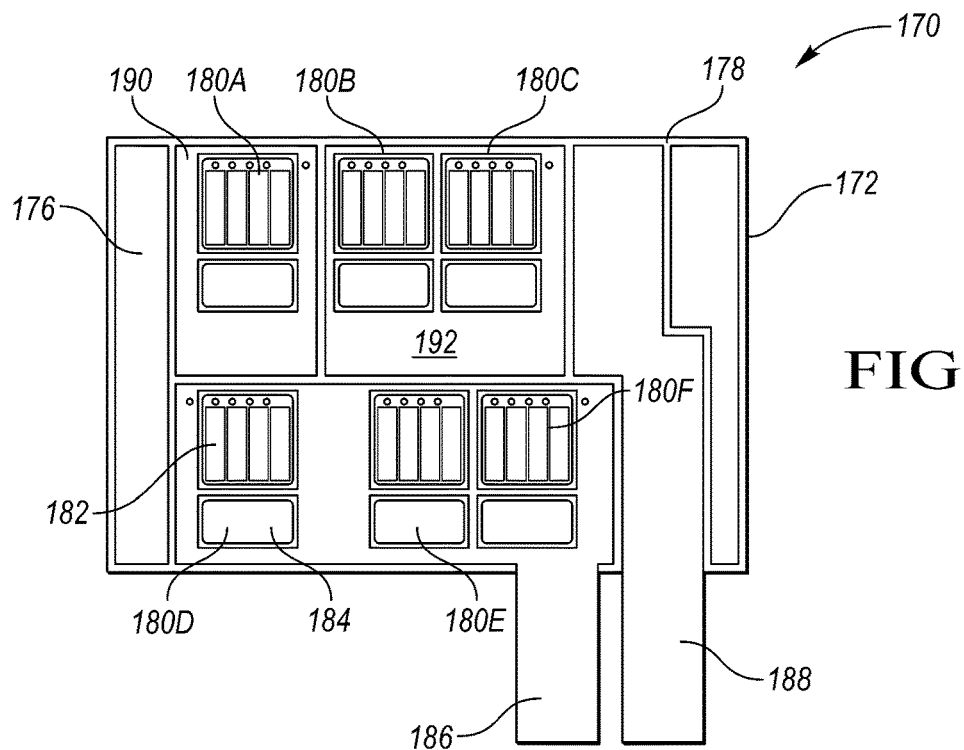
FIG. 6 is an elevation view of an internal portion of a card.
Figure 7:
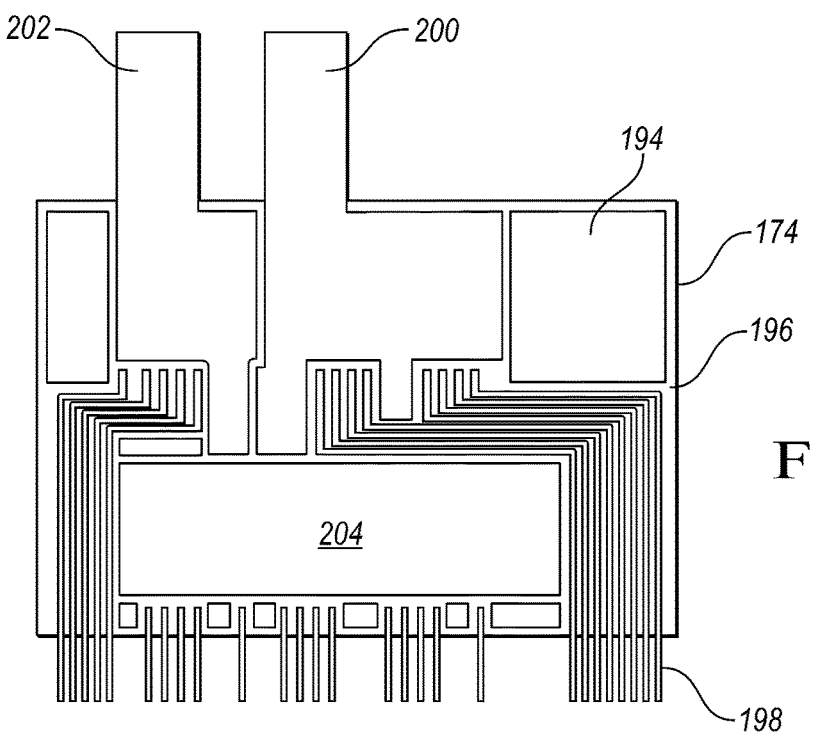
FIG. 7 is an elevation view of another internal portion of the card of FIG. 6.

FIGS. 6 and 7 illustrate another example card 170 for a power inventor servicing first and second electric machines (e.g. a motor and a generator). The card 170 includes a first substrate 172 and a second substrate 174. The first substrate 172 includes an outer layer (not shown), in inner layer 176, and a dielectric layer 178 disposed between the inner and outer layers. The inner and outer layers may be metal panels and the dielectric layer may be a ceramic panel.

In one embodiment, the first substrate 172 is assembled by bonding an outer metal panel to one side of the ceramic panel, and bonding the inner metal panel to the other side of the ceramic panel. The inner metal panel may then be processed (such as patterned by etching) transforming the single panel into a plurality of individual components. In the illustrated embodiment, the inner layer 176 is processed to form a positive DC terminal 186, a negative DC terminal 188, a first AC contact 190, and a second AC contact 192. A plurality of switching units 180 are attached to the inner layer 176. For example, a first switching unit 180A is connected to a first AC panel 190; a second switching unit 180B and a third switching unit 180C are connected to the second AC panel 192; and a fourth switching unit 180D, a fifth switching unit 180E, and a sixth switching unit 180F are connected to a positive DC terminal 186. Each of the switching units includes a transistor 182 and a diode 184. It is to be understood that the card 170 may include more or less than six switching units, and the switches may be arranged differently than described above.

The second substrate 174 includes an outer layer (not visible), and an inner layer 194, and a dielectric layer 196. The materials of the second substrate 174 may be similar to that of the first substrate 172. In the illustrated embodiment, the inner layer 194 is processed to include a plurality of signal pins 198 that electrically connect with the gate drive board and corresponding switching units 180. The second structure 174 includes an AC motor terminal 200, an AC generator terminal 202, and a DC contact 204. When the two substrates are assembled, the AC generator terminal 202 is disposed against switching unit 180D. The AC motor terminal 200 is disposed against switching units 180E and 180F. The DC contact 204 is disposed against switching units 180A, 108B, and 180C. In the illustrated embodiment, the motor is a more power electric machine than the generator. As such, four switching units (180B, 180C, 180E, and 180F) are connected to the motor and two switching units (180A and 180D) are connected to the generator.

The vehicle power inverter (such as power inverter 111) includes a power module assembly (such as power module 112) having a plurality of cards (such as cards 130 or 170) arranged in an array (or stack). The number of cards in the array is dependent upon the power requirements of the electric machines and the power capabilities of the individual cards. The power module may include a thermal management system for cooling the cards. FIGS. 8 through 11, and the associated text, disclose example embodiments of the power module.

Figure 8:
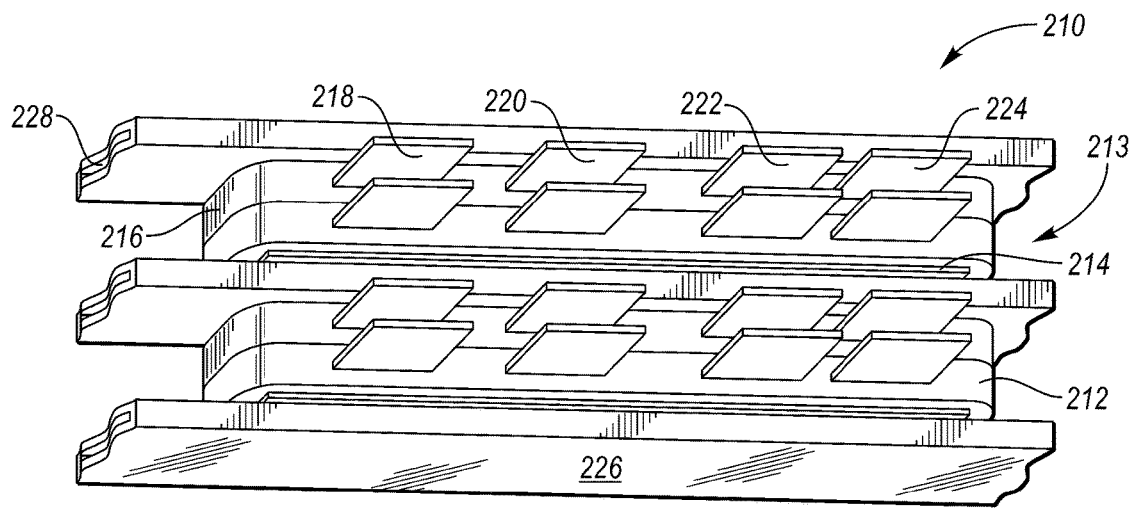
FIG. 8 is a perspective of a power module assembly.

Referring to FIG. 8, a power module 210 includes a plurality of cards 212 stacked in a one-by-four longitudinal array 213 in which each card is longitudinally adjacent to at least one other card of the stack. The cards 212 may be similar to the cards described above. The cards 212 include first and second substrates that sandwich the switching units and the terminals. Each of the first and second substrates may include an inner major side (not visible) that faces the switching units, an outer major side 214 opposite the inner major side, and minor sides 216. The terminals may extend from the minor sides 216. The terminals may include an AC motor terminal 218, an AC generator terminal 220, a positive DC terminal 222, and a negative DC terminal 224.

The cards 212 may be arranged in the stack such that at least one outer major side 214 of each of the cards 212 faces the outer major side of a longitudinally adjacent card. The power module 210 may include a plurality of cooling fins 226 for thermally regulating the power module 210. The cooling fins may cool the power module 210 by circulating a relatively cold coolant through the fins 226, or may heat the power module 210 by circulating a relatively hot coolant through the fins 226. The fins 226 may be solid metal pieces that are attached to pipes carrying coolant therethrough. Or, the fins 226 may define cooling channels 228 that circulates coolant therethrough. The coolant channels 228 are in fluid communication with inlet and outlet manifolds (not shown). The fins maybe interleaved with the cards in several different configurations depending upon the cooling requirements. In the illustrated embodiment, the cards are arranged in pairs with one major side of each card of the pair disposed against a major side of the other card of the pair. Each pair of cards is sandwiched by two cooling fins. In other embodiments, the cooling fins 226 may be interleaved with the cards 212 such that adjacent cooling fins sandwich only one card. In yet another embodiment, three or more cards may be sandwiched between adjacent fins. It is to be understood that the teaching of FIG. 8 are not limited to the illustrated one-by-four array and that the array may include more or less than four cards and some of the cards may be stacked both longitudinally and laterally adjacent to other cards of the array.

Figure 9:
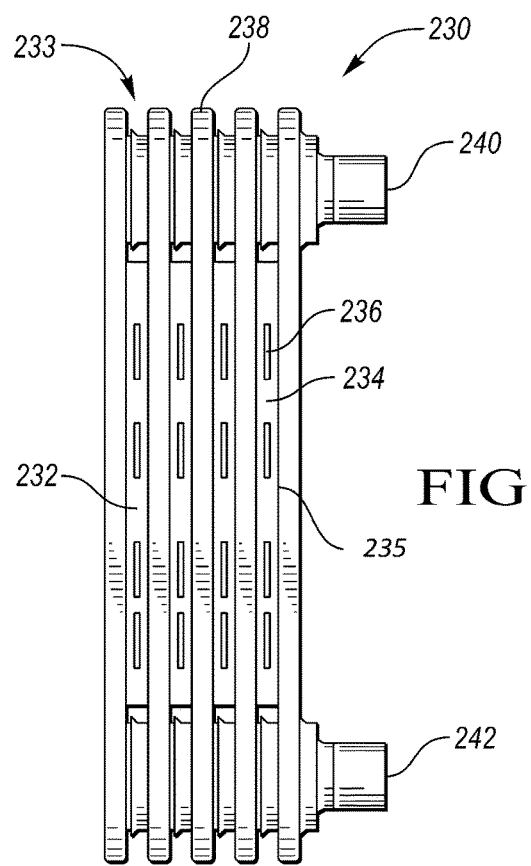
FIG. 9 is a top view of another power module assembly.

Referring to FIG. 9, the power module 230 includes a plurality of cards 232 stacked in an array 233. Each of the cards defines outer major sides 234 and includes terminals 236 extending from a minor side 235. The cards are arranged in the array such that the outer major sides 234 of adjacent cards face each other. A plurality of cooling fins 238 are interleaved with the cards and are disposed against the outer major sides 234. The cooling fins 238 are connected with an inlet manifold 240 and an outlet manifold 242 that are configured to circulate coolant through the fins 238.

Figure 10:
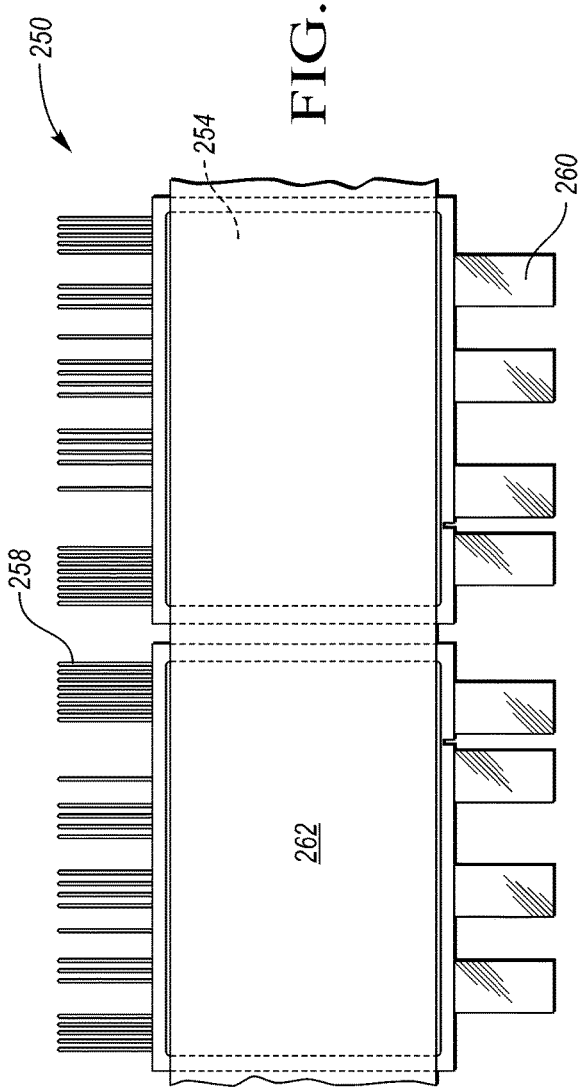
FIG. 10 is a front view of yet another power module assembly.
Figure 11:
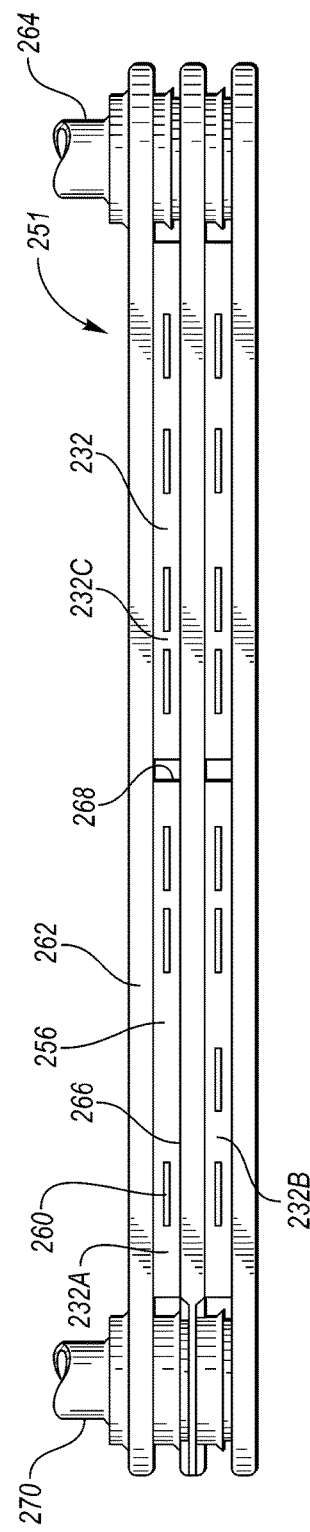
FIG. 11 is a bottom view of the power module assembly of FIG. 10.

Referring to FIGS. 10 and 11, a power module 250 includes a plurality of cards 232 arranged in a two-by-two array 251. It is to be understood that other card arrangements are contemplated. Each of the cards includes major sides 254 and minor sides 256. A plurality of signal pins 258 extends from one of the minor sides, and a plurality of terminals 260 extend from another one of the minor sides. The cards are arranged such that, for each card, one of the major sides 254 faces a major side of a longitudinally adjacent card, and one of the minor sides 256 faces a minor side of a laterally adjacent card. For example, major side 266 of card 232A faces the longitudinally adjacent card 232B and minor side 268 of card 232A faces laterally adjacent card 232C. The power module 250 includes a thermal management system having cooling fins 262, an inlet manifold 264, and outlet manifold 270. The major sides 254 of the cards are disposed against the cooling fins 262 to provide double-sided cooling of the cards.

While example embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle power system comprising:
   first and second electric machines; and
   an array of stacked cards each including
      switches arranged to transform direct current from a battery into alternating current (AC),
      a first terminal attached to some of the switches and electrically connected with the first electric machine to pass AC from the some of the switches to the first electric machine,
      a second terminal attached to the other of the switches and electrically connected with the second electric machine to pass AC from the other of the switches to the second electric machine, and
      first and second substrates sandwiching the switches and terminals.

2. The system of claim 1 wherein each of the cards further defines major sides, and the cards are stacked in the array such that one of the outer major sides of each of the cards faces a corresponding one of the outer major sides of an adjacent card.

3. The system of claim 1 further comprising cooling fins interleaved with the array such that the fins are disposed between adjacent cards.

4. The system of claim 3 wherein each of the cooling fins defines a coolant channel configured to circulate coolant therethrough.

5. The system of claim 1 wherein at least one pair of adjacent cards is stacked such that major sides of the pair are in contact with each other.

6. The system of claim 1 wherein each of the substrates further comprises an outer panel and a dielectric layer disposed between the outer panel and the switches and terminals.

7. The system of claim 6 wherein at least one of the substrates further includes an inner panel disposed against the dielectric layer and defines at least one of the first and second terminals.

8. The system of claim 1 further comprising a gate-drive board and a capacitor bank electrically connected to each of the cards.

9. A vehicle power module system comprising:
first and second electric machines:
an array of stacked cards each including
- a plurality of switches arranged to transform direct current from a battery into alternating current (AC), and
- first and second substrates sandwiching the switches and defining a first terminal electrically connected with the first electric machine to pass AC from some of the switches to the first electric machine, and a second terminal electrically connected with the second electric machine to pass AC from other of the switches to the second electric machine.

10. The system of claim 9 wherein the first substrate further includes an outer panel, an inner panel and a dielectric layer disposed therebetween, and wherein the inner panel defines at least one of the first and second terminals.

11. The system of claim 9 further comprising cooling fins interleaved with the array such that the fins are disposed between adjacent cards.

12. The system of claim 9 wherein the first terminal is attached to the some of the switches and the second terminal is attached to the other of the switches.

* * * * *